(12) United States Patent
Abesingha

(10) Patent No.: US 12,314,073 B2
(45) Date of Patent: May 27, 2025

(54) LOW VOLTAGE CASCODE CURRENT MIRROR

(71) Applicant: pSemi Corporation, San Diego, CA (US)

(72) Inventor: Buddhika Abesingha, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 283 days.

(21) Appl. No.: 18/048,729

(22) Filed: Oct. 21, 2022

(65) Prior Publication Data
US 2024/0134401 A1 Apr. 25, 2024
US 2024/0231400 A9 Jul. 11, 2024

(51) Int. Cl.
G05F 3/26 (2006.01)
G05F 1/46 (2006.01)

(52) U.S. Cl.
CPC .............. *G05F 3/262* (2013.01); *G05F 1/46* (2013.01)

(58) Field of Classification Search
CPC . G05F 3/26; G05F 3/262; G05F 1/468; G05F 1/46
See application file for complete search history.

(56) References Cited

U.S. PATENT DOCUMENTS

| | | | |
|---|---|---|---|
| 9,519,304 B1 | 12/2016 | Far | |
| 2006/0038618 A1 | 2/2006 | Wang | |
| 2006/0232340 A1* | 10/2006 | Brokaw | H03F 1/30 330/288 |
| 2008/0186101 A1 | 8/2008 | Arakali et al. | |
| 2012/0229117 A1* | 9/2012 | Nikolov | G05F 3/242 323/313 |
| 2022/0182017 A1 | 6/2022 | Birkbeck | |
| 2022/0253083 A1 | 8/2022 | Grande et al. | |

OTHER PUBLICATIONS

International Search Report and Written Opinion for International Application No. PCT/US2023/075160 filed on Sep. 26, 2023 on behalf of PSEMI Corporation Mail Date: Jan. 16, 2024 10 pages.

* cited by examiner

*Primary Examiner* — Alex Torres-Rivera
(74) *Attorney, Agent, or Firm* — Steinfl + Bruno LLP

(57) ABSTRACT

Methods and devices for a cascode current mirror with low headroom voltage are presented. According to one aspect, a gate voltage to a cascode transistor of an input leg of the current mirror is provided by a feedback block that operates from a mirrored current output by an output leg of the current mirror. The feedback block includes a feedback current mirror that outputs a mirrored current for conduction through a self-biasing diode-connected transistor that generates the gate voltage to the cascode transistor of the input leg. According to yet another aspect, the cascode current mirror includes a start-up circuit coupled between an input to the input leg and a gate of the cascode transistor of the input leg, the start-up circuit generating a start-up voltage during a transition mode of operation of the cascode current mirror. According to one aspect, a transistor is used as the start-up circuit.

20 Claims, 12 Drawing Sheets

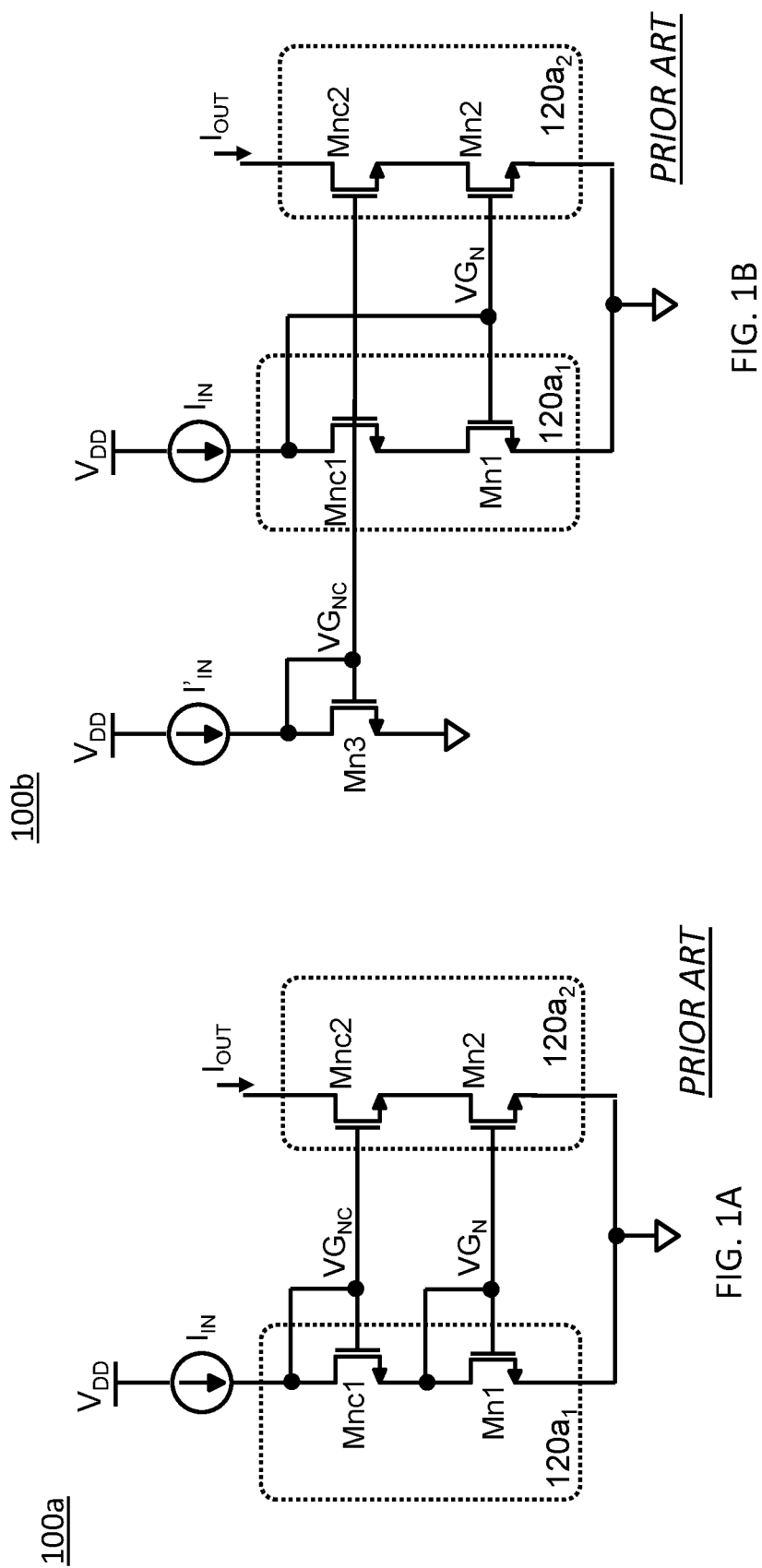
FIG. 1B *PRIOR ART*
FIG. 1A *PRIOR ART*

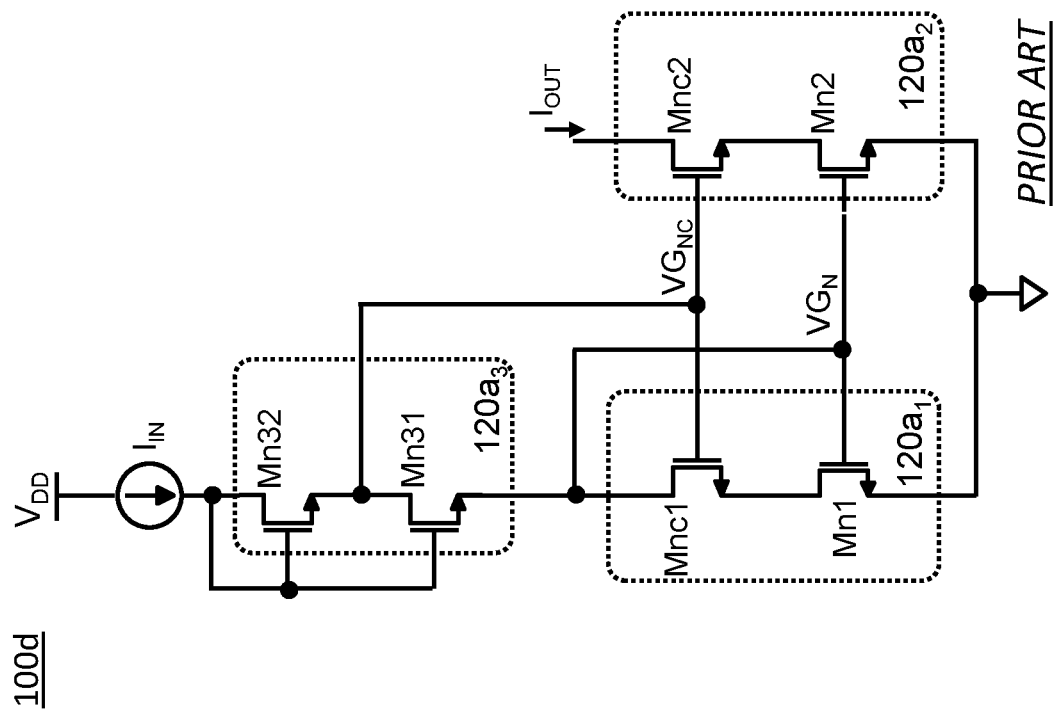
FIG. 1D *PRIOR ART*
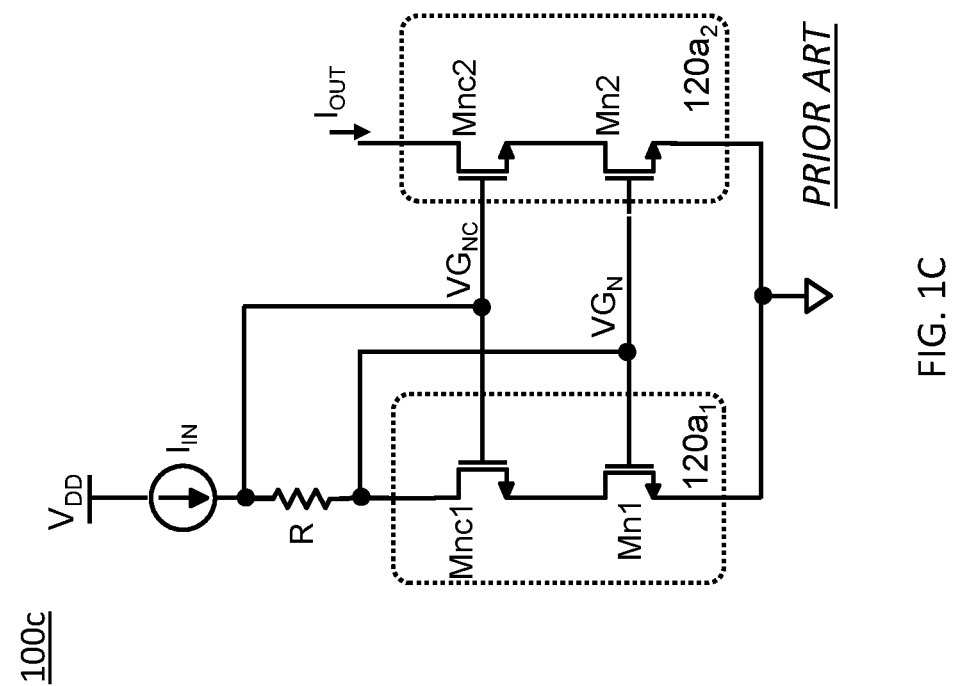
FIG. 1C *PRIOR ART*

LOW VOLTAGE CASCODE CURRENT MIRROR

TECHNICAL FIELD

The present disclosure is related to electronic circuits, and more particularly to cascode current mirrors having low headroom (voltage) requirement.

BACKGROUND

With the advent of nanometer scale technologies (i.e., <90 nm), electronic circuits may need to operate at low voltages (e.g., <1.2 volts) due to the lower breakdown voltages of transistors fabricated according to such nanometer scale technologies. Accordingly, analog signal processing may benefit from current-mode, instead of voltage-mode, approaches due to a lower headroom voltage made available by the low voltages of operation. It is therefore expected that current mirrors will take a more important role in current-mode signal processing.

Transistors fabricated according to nanometer scale technologies may however suffer from lower output resistances. When used in (e.g., an output leg of) a current mirror, a transistor with a lower output resistance may degrade performance of the current mirror and deviate from operation as an ideal current source (one with infinite output/internal resistance). This in turn may prompt a designer to increase the output resistance of the current mirror by using a cascode current mirror configuration, examples of which are shown in FIGS. 1A-1D.

The prior art cascode current mirror (100a) shown in FIG. 1A includes an input leg (120a1) that takes an input current, $I_{IN}$, from an input current source (also annotated as $I_{IN}$), and an output leg (120a2) that outputs a corresponding (sink) output current, $I_{OUT}$. Each of the input and output legs, (120a1) and (120a2), includes a respective cascode transistor stack, also referred to as cascode stack of transistors, (Mn1, Mnc1) and (Mn2, Mnc2), having respective transistors Mn1 and Mn2 that constitutes the main transistors (also called mirror transistors) within the current mirror that establishes the ratio between the input current and output current and respective cascode transistors Mnc1 and Mnc2, the respective main transistors in series connection with the respective cascode transistors. The transistors (Mn1, Mnc1) of the input leg (120a1) are in a diode-connected configuration such as to self-bias for conduction of the input current, $I_{IN}$, through such transistors. In other words, because the respective drains and gates of the transistors Mn1 and Mnc1 are connected to one another, respective gate voltages, $VG_N$, and $VG_{NC}$, self-establish for conduction of the input current, $I_{IN}$. This in turn establishes gate biasing voltages to the transistors (Mn2, Mnc2) of the output leg (120a2) for conduction of the output current, $I_{OUT}$. By ratiometrically relating transistors of the output leg (120a2) to transistors of the input leg (120a1), a corresponding ratiometric relationship between (a magnitude of) the output current, $I_{OUT}$, and (a magnitude of the) input current, $I_{IN}$, is provided. A ratiometric relationship between the transistors may be provided by ratios of sizes (e.g., width, length, ratio of width to length) of the transistors. Although the cascode current mirror (100a) may benefit from a higher output resistance (i.e., output resistance seen at drain of the cascode transistor Mnc2), it requires a headroom voltage equal to a sum of the gate-to-source voltages (Vgs) of the transistors Mn1 and Mnc1 of the input leg (120a1). In other words, operation of the prior art cascode current mirror (100a) requires a level of the supply voltage, $V_{DD}$, that is higher than the sum of the gate-to-source voltages (Vgs) of the transistors Mn1 and Mnc1 of the input leg (120a1). As a Vgs of a transistor may be close to about 0.6 volts, a two Vgs headroom can represent a substantial portion of the available supply voltage, $V_{DD}$.

The prior art cascode current mirror (100b) shown in FIG. 1B attempts to reduce the required (high) headroom voltage of the configuration (100a) by generating the gate voltage, $VG_{NC}$, of the cascode transistor, Mnc1, via an additional current source, $I'_{IN}$, that is conducted through a diode-connected transistor, Mn3, that is ratiometrically related to the cascode transistor, Mnc1. Accordingly, generation of each of the gate voltages, $VG_N$ and $VG_{NC}$, and therefore operation of the cascode current mirror (100b), can be provided with a headroom voltage that is reduced to a single Vgs drop from the supply voltage, $V_{DD}$. However, requirement for the additional current source, $I'_{IN}$, and potential issues for maintaining a proper level of the gate voltage, $VG_{NC}$, under varying conditions of the input current, $I_{IN}$, can render use of the configuration (100b) of FIG. 1B impractical.

The prior art cascode current mirrors (100c) and (100d) respectively shown in FIG. 1C and FIG. 1D also attempt to reduce the required (high) headroom voltage of the configuration (100a) by generating the gate voltage, $VG_{NC}$, through a difference voltage between the gate voltages, $VG_N$ and $VG_{NC}$. Such difference voltage is provided by a voltage drop that can be less than a transistor gate-to-source voltage, Vgs, and provided by one or more elements arranged in series connection between the input current source, $I_{IN}$, and the input leg (120a1) of the current mirror. For example, in the configuration (100c) of FIG. 1C, the voltage drop is provided by a resistor, R, and in the configuration (100d) of FIG. 1D, the voltage drop is provided by a drain-to-source voltage (Vds) of a transistor, Mn31, that is part of a transistor stack (120a3) that includes the transistor Mn31 coupled to a diode-connected transistor, Mn32. In such configurations (100c) and (100d), the elements (e.g., R, Mn31, Mn32) may be selected to provide a voltage drop that is less than a transistor gate-to-source voltage, Vgs, while conducting the input current, $I_{IN}$, and therefore allow operation of the cascode current mirrors (100c) and (100d) with a headroom voltage that is equal to the Vgs of the transistor, Mn1, plus the (non-zero) voltage drop. Although, when compared to the configuration (100c) of FIG. 1C, the configuration (100d) of FIG. 1D has the advantage of reducing process, voltage, and temperature (PVT) based variations of the generated (cascode) gate voltage, $VG_{NC}$, it includes a higher overall voltage drop due to the drain-to-source, Vds, drop of the diode-connected transistor, Mn32.

As the supply voltage, $V_{DD}$, may be a battery voltage having a nominal voltage level that may vary from about 3.3 volts down to about 1.5 volts or lower, any headroom voltage required for operation of (an input leg of) a cascode current mirror may represent a significant portion of the supply voltage, $V_{DD}$, especially at a lower range of the supply voltage. Furthermore, considering the more practical of the above prior art current mirrors (e.g., 100a, 100c, 100d), as a corresponding headroom voltage scales up with added number of cascode transistors that may be required for even higher output resistances of the current mirrors, such prior art current mirrors may simply not be realizable for operation at lower voltages as the headroom voltage required may be larger than the available supply voltage. Finally, irrespective of a requirement to operate at lower voltages, any reduction in headroom voltage can directly benefit power savings and therefore lengthen operation of portable/handheld devices using such current mirrors. It follows that providing a practical and scalable cascode current mirror with a reduced headroom voltage is a motivation of the teachings according to the present disclosure.

SUMMARY

According to a first aspect of the present disclosure, a cascode current mirror circuit is presented, comprising: an input leg comprising a first cascode stack of transistors; an intermediate output leg comprising a second cascode stack of transistors; and a feedback block comprising a feedback current mirror, the feedback block coupled to the intermediate output leg, wherein the feedback block is configured to generate a gate voltage to a cascode transistor of the input leg based on an intermediate current that is output by the intermediate output legd.

According to a second aspect of the present disclosure, a cascode current mirror circuit is presented, comprising: a main cascode current mirror with start-up helper circuit configured to receive an input current and generate therefrom a corresponding mirrored current; a feedback cascode current mirror with start-up helper circuit that is the dual of the main cascode current mirror with start-up helper circuit, the feedback cascode current mirror with start-up helper circuit configured to receive the mirrored current and generate therefrom a feedback current that is used to generate a gate voltage to a cascode transistor of the main cascode current mirror with start-up helper circuit.

According to a third aspect of the present disclosure, a method for operating a cascode current mirror with low headroom voltage is presented, the method comprising: i) providing a cascode current mirror comprising an input leg and an intermediate output leg; ii) coupling an input current to the input leg to a gate of a main transistor of the input leg; iii) coupling a start-up helper circuit between the gate of the main transistor and a gate of a cascode transistor of the input leg; and iv) based on steps ii) and iii), generating a gate voltage to the gate of the cascode transistor of the input leg during a transition mode of operation that immediately follows start-up of the cascode current mirror.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 1A, 1B, 1C and 1D show various prior art cascode current mirrors.

Like reference numbers and designations in the various drawings indicate like elements.

DETAILED DESCRIPTION

Figure 2A:
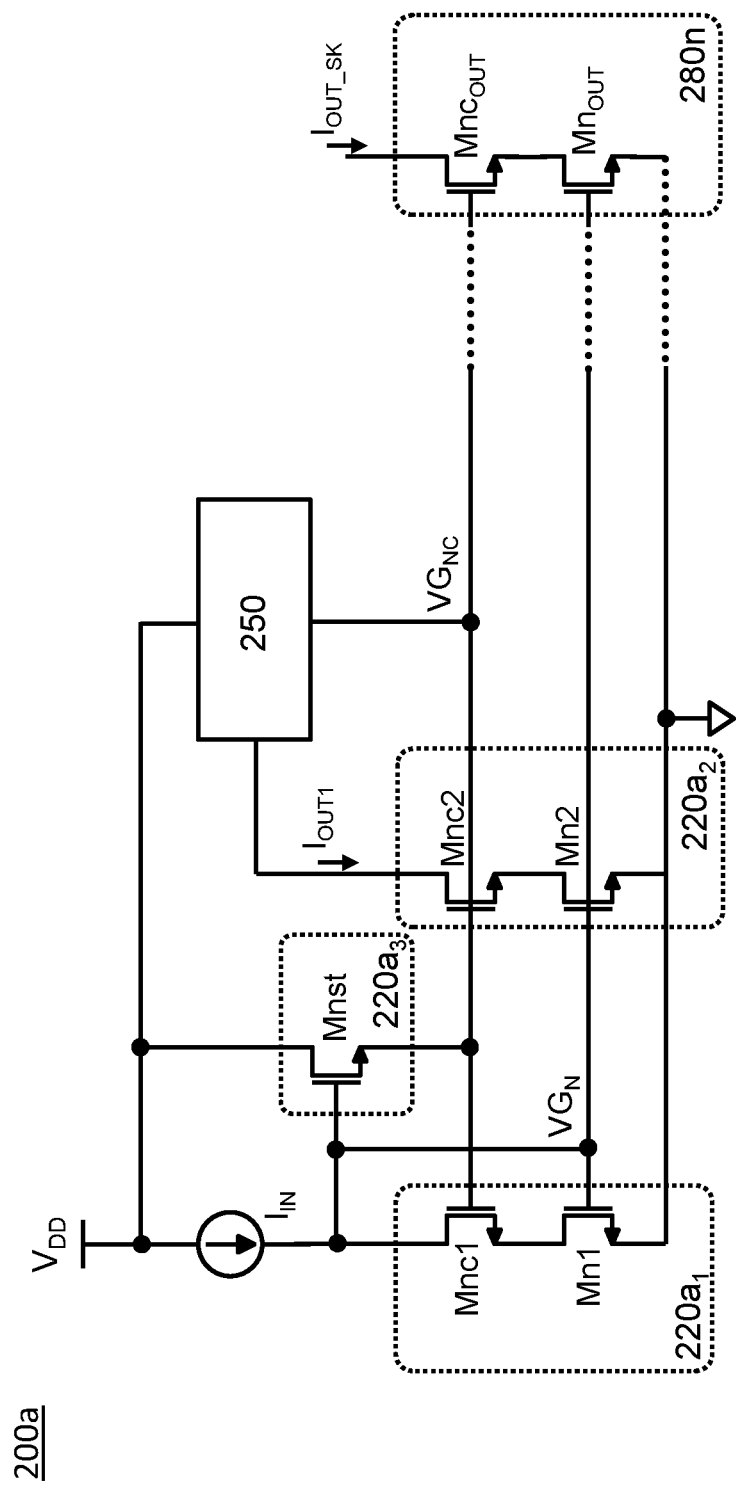
FIG. 2A shows a simplified schematic of a cascode current mirror according to an embodiment of the present disclosure, including a feedback block for generation of a cascode gate voltage.

As shown in FIG. 2A, teachings according to present disclosure further reduce the required headroom voltage to operate a cascode current mirror (200a) by using a feedback block (250, circuit) to generate the gate voltage, $VG_{NC}$, to the cascode transistor, Mnc1, of the input leg. (220a1). As shown in FIG. 2A, the feedback block (250) according to the present teachings may take a (mirrored) current, $I_{OUT1}$, generated by mirroring the input current, $I_{IN}$, that is conducted in the input leg (220a1), via an intermediate output leg (220a2). In other words, in contrast to the prior art cascode current mirrors described above, the gate voltage, $VG_{NC}$, may not be (directly) generated via the input current, $I_{IN}$, rather via a mirrored current, $I_{OUT1}$, conducted through a different leg (e.g., 220a2) that includes a cascode transistor stack (Mn2, Mnc2). In turn the feedback block (250) takes the current, $I_{OUT1}$, as input to generate the gate voltage, $VG_{NC}$, to the cascode transistor, Mnc1. On the other hand, the gate voltage $VG_N$, to the (main) transistor, Mn1, may be established via direct coupling/connection of the gate of the transistor, Mn1, to the input current source, $I_{IN}$, or in other words, to the drain of cascode transistor Mnc1.

With continued reference to FIG. 2A, according to an embodiment of the present disclosure, the transistors Mn2 and Mnc2 of the intermediate output leg (220a2) may be designed to conduct a same current as the transistors Mn1 and Mnc1 of the input leg (220a1). In other words, considering a steady state mode of operation of the cascode current mirror (200a) defined by steady state levels of the gate voltages (e.g., $VG_N$, $VG_{NC}$) to the various legs shown in FIG. 2A, a magnitude of the current, $I_{OUT1}$, may be equal to a magnitude of the current, $I_{IN}$. According to other embodiments of the present disclosure, the transistors Mn2 and Mnc2 of the intermediate output leg (220a2) may be designed to conduct, during the steady state mode of operation of the cascode current mirror (200a), a current, $I_{OUT1}$, that is different from the input current, $I_{IN}$. As described later, a ratiometric relationship between the sizes of the transistors (Mn1, Mnc1) and (Mn2, Mnc2) may be used to design transistors used in the feedback block (250) to generate the gate voltage, $VG_{NC}$.

With further reference to FIG. 2A, the cascode current mirror (200a) according to the present teachings may include an output leg (280n) that includes a cascode transistor stack ($Mn_{OUT}$, $Mnc_{OUT}$) biased via the gate voltages ($VG_N$, $VG_{NC}$) to produce an output (sink) current, $I_{OUT\_SK}$, that is based on the input current, $I_{IN}$. By ratiometrically relating transistors of the output leg (280n) to transistors of the input leg (220*a*1), a corresponding ratiometric relationship between (a magnitude of) the output current, $I_{OUT\_SK}$, and (a magnitude of the) input current, $I_{IN}$, may be provided. As later described with reference to, for example, FIG. 3, the cascode current mirror according to the present teachings may include a complementary output leg (e.g., 280*p* of FIG. 3) that produces an output (source) current (e.g., $I_{OUT\_SC}$ of FIG. 3) that is based on the input current, $I_{IN}$.

According to an embodiment of the present disclosure, block (250) of FIG. 2A generates the (output) voltage, $VG_{NC}$. It will be understood that the gate voltage, $VG_{NC}$, is equal to the gate-to-source voltage, Vgs, of the cascode transistor, Mnc1, plus the drain-to-source voltage, Vds, of the main transistor, Mn1. Accordingly, the voltage generated by the feedback block (250) may be reduced by reducing the drain-to-source voltage, Vds, of the main transistor, Mn1 (e.g., via design parameters of the transistor). Accordingly, headroom voltage required for operation of the output leg (280*n*), which may be defined by the gate voltage, $VG_{NC}$, may be lowered by reducing such drain-to-source voltage, Vds, of the main transistor, Mn1. On the other hand, the required headroom voltage for operation of the input leg (Mn1, Mnc1) may be equal to the gate-to-source voltage, Vgs, of the main transistor, Mn1, which may be defined by the gate voltage, $VG_N$. In other words, the input leg (stage) of the cascode current mirror (200*a*) according to the present teachings may operate at a headroom voltage that is similar (i.e., one gate-to-source voltage, Vgs) to one provided by the prior art configuration described above with reference to FIG. 1B, but without requiring an additional current source (e.g., I'$_{IN}$ of FIG. 1B).

Upon start-up of the cascode current mirror (200*a*) of FIG. 2A, the gate voltages, $VG_N$ and $VG_{NC}$, may be at a zero-voltage level (e.g., since supply voltage $V_{DD}$ may be disconnected/disabled), and therefore no current may be conducted through the cascode transistor Mnc1. Varying the gate voltage, $VG_N$, to the main transistor, Mn1, may not change conduction state of the cascode transistor, Mnc1, and therefore no current may flow through the input leg (220*a*1) or the intermediate output leg (220*a*2). It follows that according to an example embodiment of the present disclosure, a start-up helper, or a kick-start, circuit block (220*a*3) may be coupled (connected) between the input current source, $I_{IN}$, and the gate of the cascode transistor, Mnc1, to provide/enable a (start-up) conduction of the cascode transistor, Mnc1.

With continued reference to FIG. 2A, according to an embodiment of the present disclosure, the circuit block (220*a*3) may be configured to generate a varying level of the gate voltage, $VG_{NC}$, during a transition mode of operation of the cascode current mirror (200*a*), the transition mode of operation based on a time it may take the cascode current mirror (200*a*) to reach its steady state mode of operation defined by the gate voltage, $VG_{NC}$, (and the gate voltage $VG_N$) being at its steady state level.

Upon start-up of the cascode current mirror (200*a*) of FIG. 2A, and during operation according to the transition mode of operation, the gate voltage, $VG_N$, may increase for conduction through the main transistor, Mn1, of the input current, $I_{IN}$. Since the gate voltage, $VG_N$, is coupled to an input of the circuit block (220*a*3), such increase of the gate voltage, $VG_N$, may in turn cause an output of the circuit block (220*a*3) that is coupled to the gate of the cascode transistor, Mnc1, to increase the gate voltage, $VG_{NC}$, thereby allowing current flow through the transistors Mnc1 and Mn1. Such increase in the gate voltage, $VG_N$, and therefore in the gate voltage, $VG_{NC}$, may continue till the cascode stack (220*a*1) may be biased for (exact) conduction of the input current, $I_{IN}$, or in other words, till operation according to the steady state mode.

With continued reference to FIG. 2A, according to an embodiment of the present disclosure, during the steady state mode of operation, the gate voltage, $VG_{NC}$, may be generated solely by the feedback block (250) based on the (mirrored) current, $I_{OUT1}$. In other words, during the steady mode of operation, the circuit block (220*a*3) may not have any effect on the gate voltage, $VG_{NC}$. On the other hand, during at least a portion of the transition mode immediately after the start-up, the gate voltage, $VG_{NC}$, may be generated solely by the circuit block (220*a*3), and during a next portion of the transition mode, up until the steady state mode of operation, the gate voltage, $VG_{NC}$, may be generated by a combined operation of the circuit block (220*a*3) and the feedback block (250). In some embodiments, the circuit block (220*a*3) may contribute to stabilizing the gate voltage, $VG_{NC}$. In some embodiments, the circuit block (220*a*3) may help maintain a value of the gate voltage, $VG_{NC}$, when there is an interruption and/or glitch in $V_{DD}$.

With continued reference to FIG. 2A, according to an embodiment of the present disclosure, the circuit block (220*a*3) may include a (start-up) transistor, Mnst, comprising a first (control) terminal (e.g., gate) that is connected/coupled to the output (i.e., drain of Mnc1) of the cascode stack (220*a*1), a second (output) terminal (e.g., source) connected/coupled to the gate of the transistor, Mnc1, and a third (bias) terminal (e.g., drain) connected/coupled to the supply voltage, $V_{DD}$. Upon start-up, the gate voltage ($VG_N$) of the cascode transistor may be higher than the source voltage ($VG_{NC}$) to the transistor, and therefore the transistor, Mnst, conducts to establish the cascode gate voltage, $VG_{NC}$. As the cascode gate voltage, $VG_{NC}$, increases to its steady-state level, and therefore to a level that is higher than a level of the gate voltage, $VG_N$, the gate-to-source, Vgs, of the transistor, Mnst, decreases till the transistor stops conducting, and therefore (effectively) decouples from the gate of the cascode transistor, Mnc1. It should be noted that the cascode current mirror (200*a*) shown in FIG. 2A includes n-type input and output legs (220*a*1, 220*a*2) that include n-type (NMOS) FET transistors (Mn1, Mn2, Mnc1, Mnc2), the legs (220*a*1, 220*a*2) configured to "sink" respective currents $I_{IN}$ and $I_{OUT1}$. Accordingly, the circuit block (220*a*3) may include a same polarity (i.e., n-type) NMOS FET transistor, Mnst. Teachings according to the present disclosure may equally apply to a dual/complementary cascode current mirror configuration that includes p-type transistors (e.g., PMOS FETs) for provision of input and output legs that are configured to "source" respective currents (e.g., FIG. 4 later described).

Figure 2B:
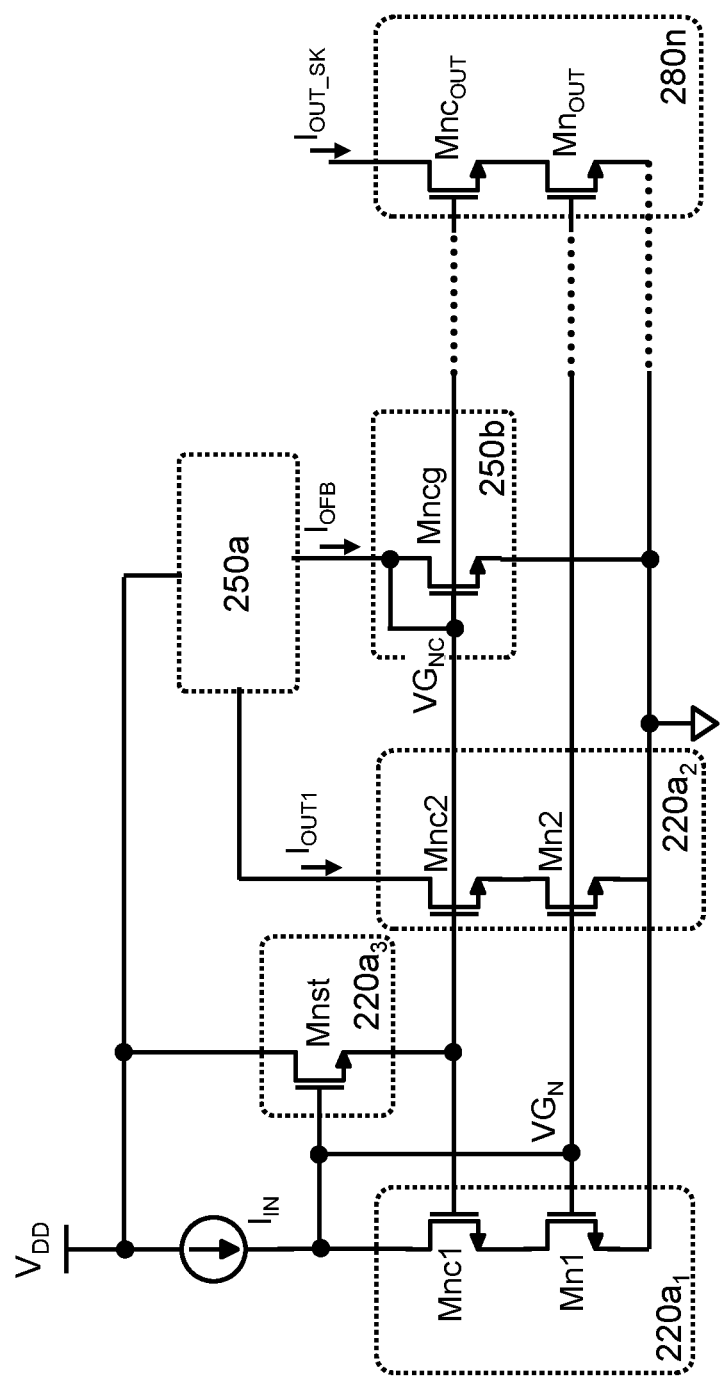
FIG. 2B shows details of a circuit for generation of the cascode gate voltage of FIG. 2A based on a current generated by the feedback block.

FIG. 2B shows details of a circuit block (250*b*) for generation of the cascode gate voltage, $VG_{NC}$, based on a current, $I_{OFB}$, generated by a circuit block (250*a*) within the feedback block (250). In other words, according to an embodiment of the present disclosure, the circuit block (250*a*), part of the feedback block (250), may generate a (source) current, $I_{OFB}$, based on the input (sink) current, $I_{OUT1}$, the current, $I_{OFB}$, provided to the circuit block (250*b*), part of the feedback block (250), to generate the cascode gate voltage, $VG_{NC}$. According to an embodiment of the present disclosure, and as shown in FIG. 2B, the circuit block (250*b*) may include a diode-connected transistor, Mncg, that self-biases to establish conduction of the current, $I_{OFB}$, between its drain/gate and source (coupled to the reference ground) terminals. In turn self-biasing of the diode-connected transistor, Mncg, may generate the cascode gate voltage, $VG_{NC}$.

Figure 3:
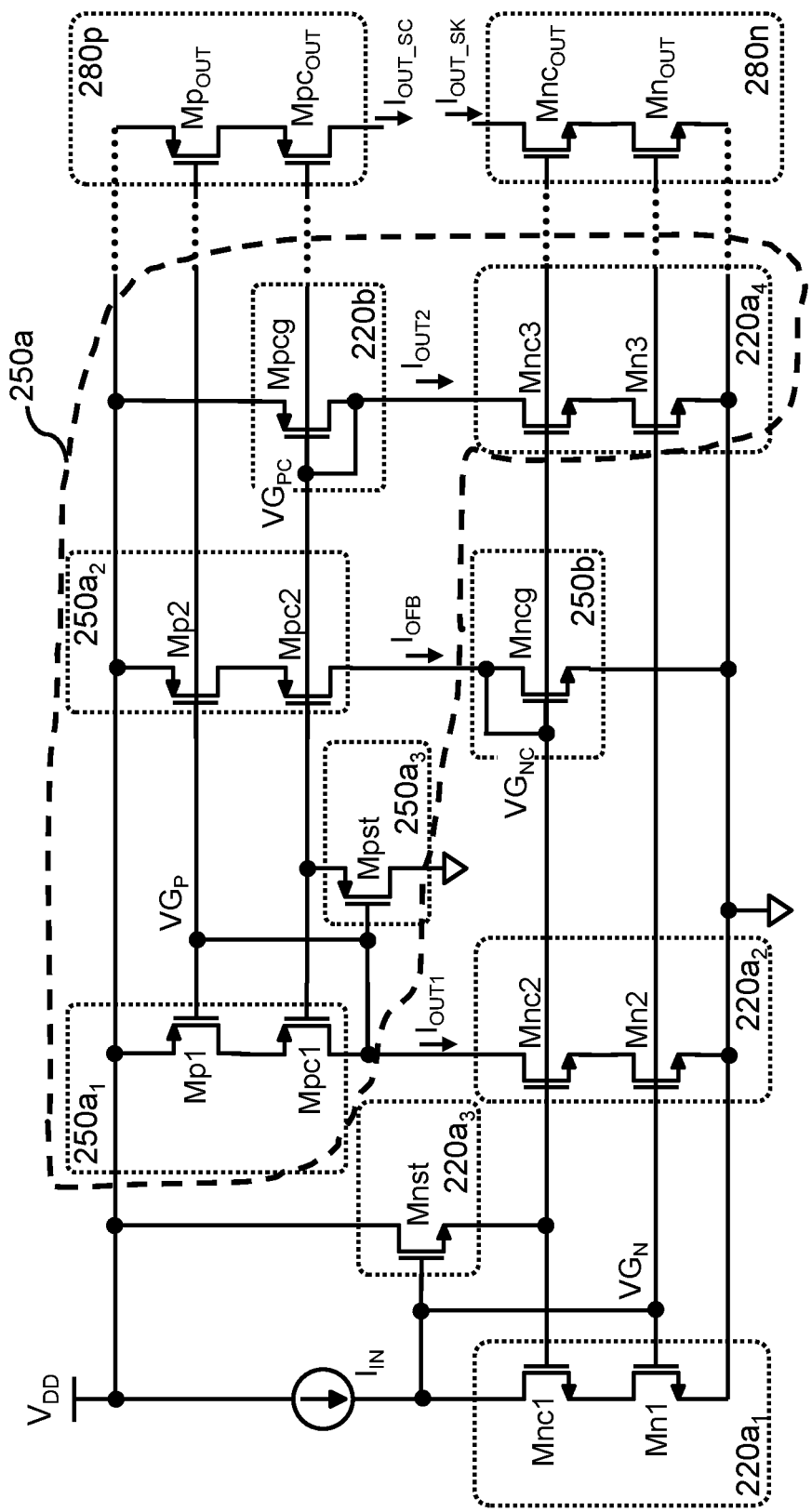
FIG. 3 shows details of a feedback block that may be used in the cascode current mirror of FIG. 2A according to an embodiment of the present disclosure.

With continued reference to FIG. 2B and reference to FIG. 3, by ratiometrically relating the transistors Mnc1 and Mncg, and (therefore) the currents $I_{IN}$, $I_{OUT1}$, and $I_{OFB}$, then the generated cascode gate voltage, $VG_{NC}$, may be suitable for conduction of the input current, $I_{IN}$, through the cascode transistor, Mnc1, of the input leg (220a1). According to an embodiment of the present disclosure, ratiometrically relating of the currents, $I_{OUT1}$ and $I_{OFB}$, may be provided by a (feedback) current mirror (e.g., 250a1, 250a2 of FIG. 3) included in the circuit block (250a) of the feedback block (250), such current mirror configured to take the current $I_{OUT1}$ as input to a respective input leg (e.g., 250a1 of FIG. 3) and output the current $I_{OFB}$ through a respective output leg (e.g., 250a2 of FIG. 3). It should be noted that although the foregoing will describe such feedback current mirror as a cascode current mirror that may be considered, in some case, a dual/complementary of the (main) cascode current mirror (e.g., 220a1, 220a2, 220a3), teaching according to the present disclosure may equally apply to use of a feedback current mirror that is not necessarily of a cascode type (e.g., single transistor per leg) for generation of the current $I_{OFB}$.

FIG. 3 shows details of a feedback block (250a, 250b) that may be used in the cascode current mirror (200a) of FIG. 2A/2B. In particular, FIG. 3 shows details, according to an embodiment of the present disclosure, of the circuit block (250a) shown in FIG. 2B. As described above with reference to FIG. 2B, the circuit block (250a) may include a (feedback) cascode current mirror (250a1, 250a2) having an input leg (250a1) comprising transistors (Mp1, Mpc1), the input leg (250a1) coupled between the supply voltage, $V_{DD}$, and the intermediate output leg (220a2) such as to receive the current, $I_{OUT1}$, as input. Furthermore, the cascode current mirror (250a1, 250a2) may include an output leg (250a2) comprising transistors (Mp2, Mpc2), wherein the output leg (250a2), coupled between the supply voltage, $V_{DD}$, and the circuit block (250b, e.g., diode-connected transistor Mncg), is configured to mirror the current, $I_{OUT1}$, of the input leg (Mp1, Mpc1), to generate therefrom the output current, $I_{OFB}$.

It should be noted that for operation according to a current mirror, and as shown in FIG. 3 (and other figures of the present disclosure), respective gates of transistors of the input leg (e.g., Mp1, Mpc1) are provided same biasing voltages (e.g., $VG_P$, $VG_{PC}$) as to the respective gates of transistors of the output leg (e.g., Mp2, Mpc2). Accordingly, operation of the feedback block (250), including blocks (250a, 250b) for generation of the gate voltage, $VG_{NC}$, may be provided via a headroom voltage that is equal to the gate voltage, $VG_{NC}$, plus the drain-to-source voltages, Vds, of the transistors Mp2 and Mpc2. As previously noted, such drain-to-source voltages may be small (e.g., down to 50 mV or smaller) via design of the transistors, and therefore, the headroom voltage required for generation of the gate voltage, $VG_{NC}$, by the feedback block (250) may be substantially equal to one gate-to-source, Vgs, voltage.

With continued reference to FIG. 3, the input leg (250a1) of the feedback current mirror (250a1, 250a2) may include a start-up condition (e.g., gate of cascode transistor Mpc2 high at start-up) that produces effects similar to one described above with reference to the input leg (220a1). It follows that according to an example embodiment of the present disclosure, the feedback block (250a) may further include a start-up helper, or a kick-start, circuit block (250a3) coupled (connected) between an input (e.g., drain of transistor Mpc1) of the input leg (250a1) and a gate of the cascode transistor, Mpc1, to provide/enable a (start-up) conduction of the cascode transistor, Mpc1. Further details of operation of the circuit block (250a3), including based on a corresponding transistor, Mpst, can be taken from the above description of the circuit block (220a3) and corresponding transistor, Mnst, while considering the opposite polarities (e.g., n-type vs p-type) of such transistors and their different start-up conditions (e.g., low vs high start-up gate voltages).

With further reference to FIG. 3, according to an embodiment of the present disclosure, the gate voltage, $VG_{PC}$, to the cascode transistor, Mpc1, of the input leg (250a1) of the feedback current mirror (250a1, 250a2) may be generated via a circuit (e.g., 220a4, 220b) similar to one described above (e.g., 250a2, 250b) for generation of the gate voltage, $VG_{NC}$, to the cascode transistor, Mnc1, while considering the opposite polarities (e.g., n-type vs p-type) of transistors used in the two current mirrors (220a1, 220a2) and (250a1, 250a2) and therefore, of their respective output currents (e.g., $I_{OUT1}$ is a sink output current for the output leg 220a2, and $I_{OFB}$ is a source output current for the output leg 250a2).

According to an example embodiment of the present disclosure, and as shown in FIG. 3, the gate voltage, $VG_{PC}$, may be generated via conduction of a current, $I_{OUT2}$, through a diode-connected transistor, Mpcg, wherein the current, $I_{OUT2}$, and the transistor, Mpcg, may respectively be ratiometrically related to the current, $I_{OUT1}$ (and therefore $I_{OFB}$), and to the transistor, Mpc1. According to an embodiment of the present disclosure, the current, $I_{OUT2}$, may be generated with a cascode transistor stack (Mn3, Mnc3) that may be considered as an additional intermediate output leg (220a4) of the input leg (220a1). This is possible since all of the currents shown in FIG. 3 may be ratiometrically related, and further based on (known) ratiometric relationship of (transistors of) the various legs shown in FIG. 3.

With continued reference to FIG. 3, the circuit block (250a) may be described as including a feedback current mirror with start-up helper circuit (250a1, 250a2, 250a3) that is the dual/complementary of a (main) cascode current mirror with start-up helper circuit (220a1, 220a2, 220a3). In other words, transistors used in the dual circuit (250a1, 250a2, 250a3) may be of opposite polarity (e.g., p-type) to transistors used in main circuit (220a1, 220a2, 220a3). As shown in FIG. 3, an output/mirrored current (e.g., $I_{OUT1}$) of the main circuit (220a1, 220a2, 220a3) may be an input current of the dual circuit (250a1, 250a2, 250a3). Furthermore, the (cascode) gate voltage, $VG_{NC}$, to the main circuit (220a1, 220a2, 220a3) may be generated via conduction of a current (e.g., $I_{OFB}$) that is a mirrored current of the input current (e.g., $I_{OUT1}$) to the dual circuit (250a1, 250a2, 250a3) through a diode-connected transistor (e.g., Mncg) of a same polarity (e.g., n-type) as the polarity of transistors of the main circuit (220a1, 220a2, 220a3). Likewise, the (cascode) gate voltage, $VG_{PC}$, to the dual circuit (250a1, 250a2, 250a3) may be generated via conduction of a current (e.g., $I_{OUT2}$) that is a mirrored current of the input current (e.g., $I_{IN}$) to the main circuit (220a1, 220a2, 220a3) through a diode-connected transistor (e.g., Mpcg) of a same polarity (e.g., p-type) as the polarity of transistors of the dual circuit (250a1, 250a2, 250a3).

With continued reference to FIG. 3, according to the present disclosure, the main circuit (220a1, 220a2, 220a3) may be referred to as an n-type cascode current mirror with start-up helper circuit, and the dual circuit (250a1, 250a2, 250a3) may be referred to as a p-type cascode current mirror with start-up helper circuit. Furthermore, as the current mirror legs (220a1, 220a2) are coupled to a low side reference voltage (i.e., reference ground) and the current mirror legs (250a1, 250a2) are coupled to a high side supply voltage (i.e., $V_{DD}$), the main circuit (220a1, 220a2, 220a3) may be referred to as a low-side (n-type) cascode current mirror with start-up helper circuit, and the dual circuit (250a1, 250a2, 250a3) may be referred to as a high-side (p-type) cascode current mirror with start-up helper circuit.

As shown in FIG. 3, complementary output legs (280n) and (280p), respectively provided by mirroring input currents (e.g., $I_{IN}$ and $I_{OUT1}$) through the input legs (e.g., 220a1 and 250a1) of the low-side and high-side cascode current mirrors (220a1, 220a2, 220a3, and 250a1, 250a2, 250a3), may provide output sink and source currents $I_{OUT\_SK}$ and $I_{OUT\_SC}$. By ratiometrically relating transistors (Mnout, Mncout) of the (low-side) output leg (280n) to transistors of the (low-side) input leg (220a1), a corresponding ratiometric relationship between (a magnitude of) the output sink current, $I_{OUT\_SK}$, and (a magnitude of the) input current, $I_{IN}$, may be provided. Likewise, by ratiometrically relating transistors (Mpout, Mpcout) of the (high-side) output leg (280p) to transistors of the (high-side) input leg (250a1), a corresponding ratiometric relationship between (a magnitude of) the output source current, $I_{OUT\_SC}$, and (a magnitude of the) input current, $I_{OUT1}$, and therefore of the input current, $I_{IN}$, may be provided.

Figure 4:
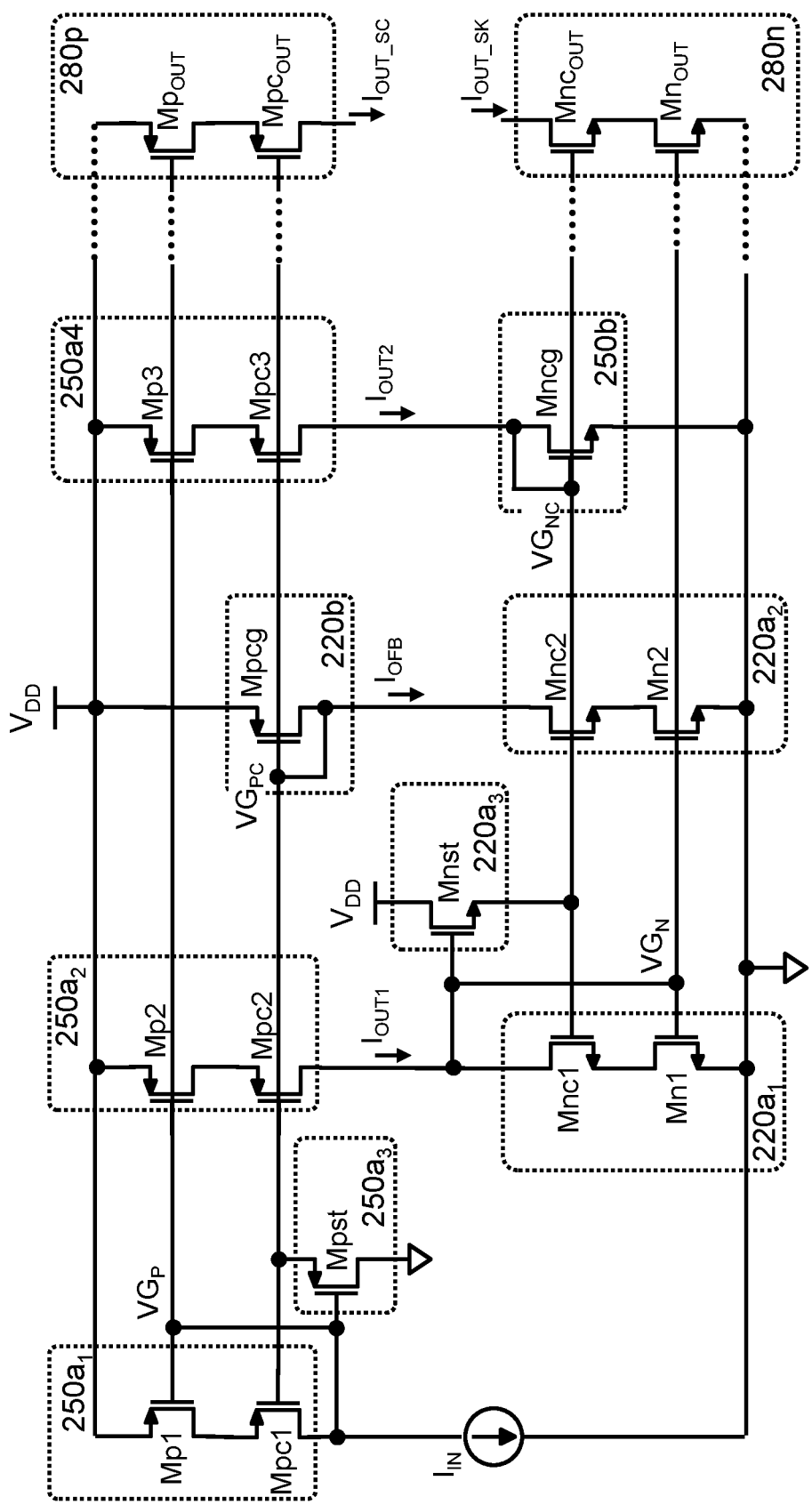
FIG. 4 shows a simplified schematic of another cascode current mirror according to an embodiment of the present disclosure.

Teachings according to the present disclosure may not be limited to a (main) cascode current mirror (e.g., 220a1, 220a2, 220a3 of FIG. 3) having an input leg (e.g., 220a1 of FIG. 3) that is configured to sink an input current (e.g., $I_{IN}$ of FIG. 3). As shown in FIG. 4, a dual/complementary configuration of the configuration shown in FIG. 3 may be used for sourcing of an input current, $I_{IN}$. Such dual configuration may be obtained by considering, as shown in FIG. 4, a main circuit (250a1, 250a2, 250a3) that may be a high-side (p-type) cascode current mirror with start-up helper circuit similar to one described above with reference to FIG. 3 but for receiving the input current, $I_{IN}$, and a corresponding dual circuit (220a1, 220a2, 220a3) that may be a low-side (n-type) cascode current mirror with start-up helper circuit similar to one described above with reference to FIG. 3 but for receiving the output current, $I_{OUT1}$. Details of other aspects of the configuration shown in FIG. 4 can be taken from the above description with reference to FIG. 3, including details related to the generation of the cascode gate voltages $VG_{PC}$ (likened to $VG_{NC}$ of FIG. 3) and $VG_{NC}$ (likened to $VG_{PC}$ of FIG. 3). Performance in terms of required headroom voltage for operation of the cascode current mirror of FIG. 4 is similar to one described above with reference to FIG. 3 (e.g., headroom voltage of about one Vgs).

Figure 5A:
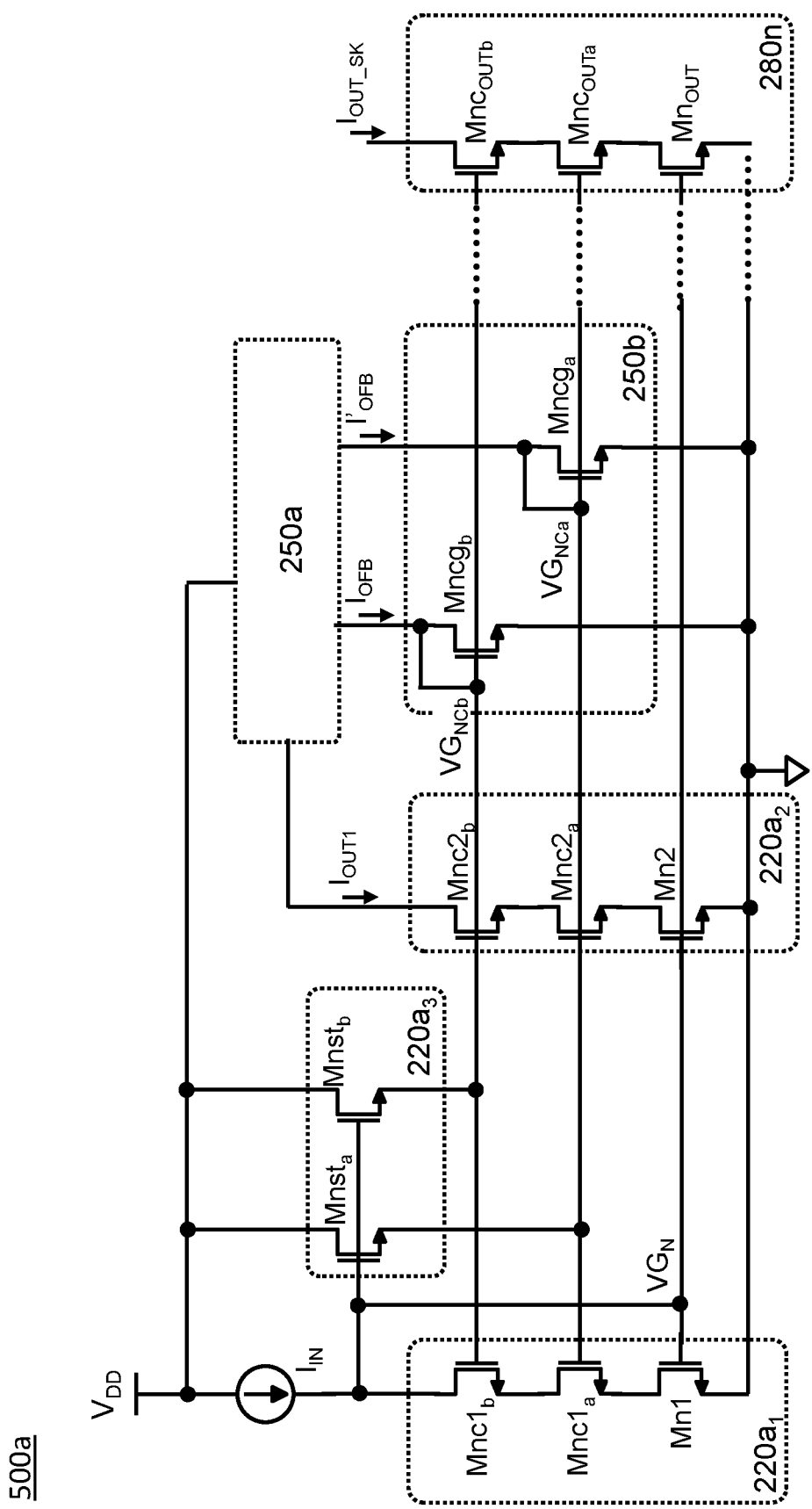
FIG. 5A shows a simplified schematic of a cascode current mirror that is based on the current mirror of FIG. 2B with increased cascode stack height.

FIG. 5A shows a simplified schematic of a cascode current mirror (500a) according to an embodiment of the present disclosure that is based on the cascode current mirror described above with reference to FIG. 2B, with increased cascode stack height. In other words, a number of cascode transistors in the various legs (e.g., 220a1, 220a2, 22a3) of the cascode current mirror (500a) may be greater than one, such as, for example, two (as shown in FIG. 5A), or even more than two, while maintaining performance in terms of required headroom voltage. According to an embodiment of the present disclosure, as shown in FIG. 5A, the start-up helper, or a kick-start, circuit block (220a3) may be configured to generate varying levels of the (cascode) gate voltages, $VG_{NCa}$ and $VG_{NCb}$, during a transition mode of operation of the cascode current mirror (500a), the transition mode of operation based on a time it may take the cascode current mirror (500a) to reach its steady state mode of operation defined by the gate voltages, $VG_{NCa}$ and $VG_{NCb}$, (and the gate voltage $VG_N$) being at their respective steady state levels.

According to an embodiment of the present disclosure, as shown in FIG. 5A, the circuit block (220a3) may include a respective (start-up) transistor (e.g., Mnsta, Mnstb) for provision of the (transition/start-up) gate voltage to each of the cascode transistors (e.g., Mnc1a, Mnc1b). Operation of each such transistor may be taken from the above description with reference to transistor Mnst of FIG. 2A/2B. Similarly, as shown in FIG. 5A, generation of the gate voltages, $VG_{NCa}$ and $VG_{NCb}$, may be provided by conduction of respective currents, $I_{OFB}$ and $I'_{OFB}$, through respective diode-connected transistors, Mncga and Mncgb, wherein the respective currents, $I_{OFB}$ and $I'_{OFB}$, may be generated by the circuit block (250a) in a manner similar to one described above with reference to FIG. 2A for generation of the current, $I_{OFB}$. It should be noted that the currents $I_{OFB}$ and $I'_{OFB}$, may be of a same magnitude, or different magnitudes, so long as ratiometric relationships between transistors and currents are respected. Other aspects for generation of the gate voltages, $VG_{NCa}$ and $VG_{NCb}$, may be taken from the above description with reference to FIG. 2B.

Figure 5B:
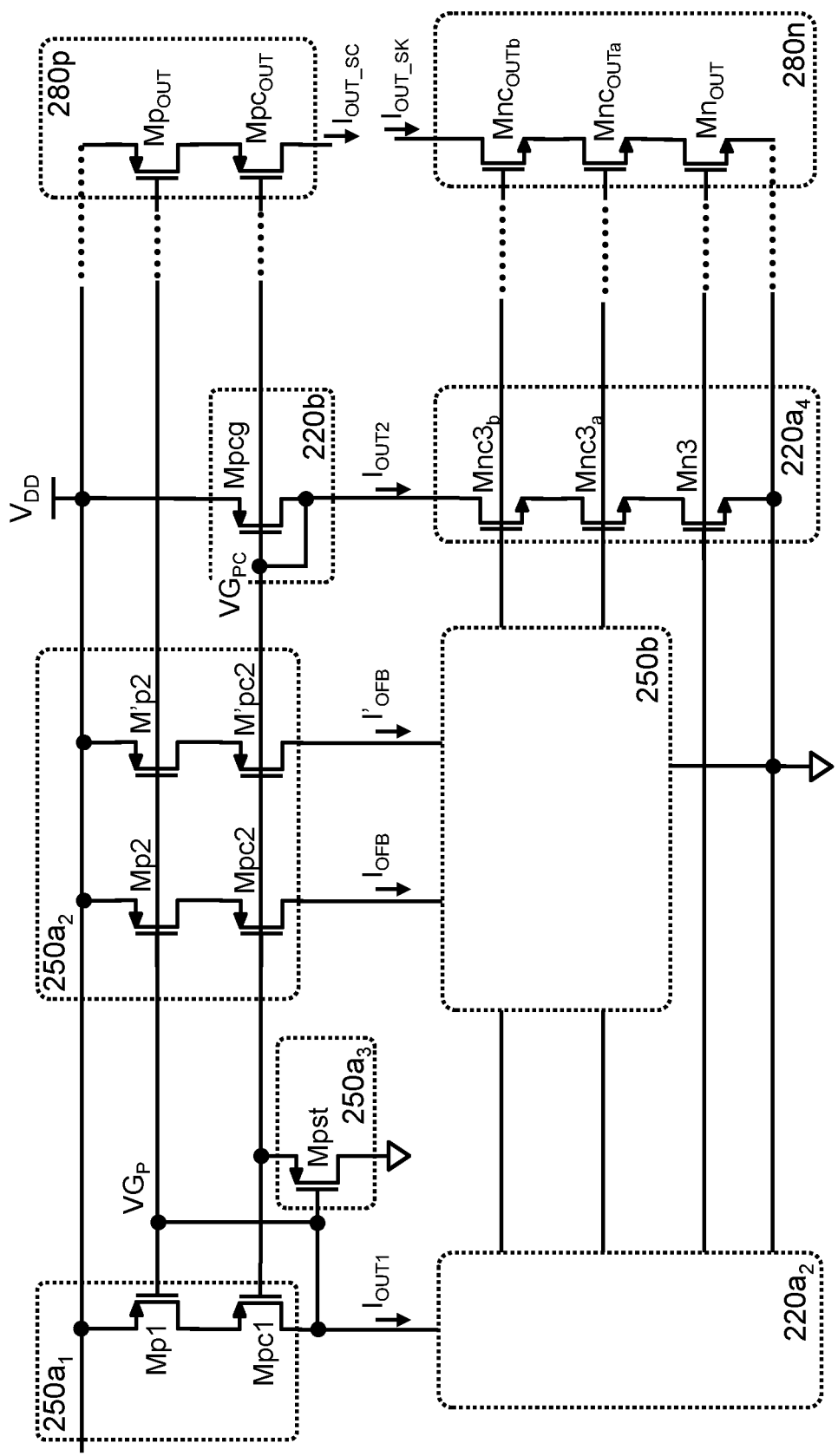
FIG. 5B shows details of a feedback block that may be used in the cascode current mirror of FIG. 5A.

FIG. 5B shows details of elements of a feedback block (250a, 250b) that may be used in the cascode current mirror (500a) of FIG. 5A. In particular, FIG. 5B shows details, according to an embodiment of the present disclosure, of the circuit block (250a) shown in FIG. 5A. It should be noted that such details may be readily understood based on the above description related to FIGS. 2A/2B/3. Accordingly, as shown in FIG. 5B, the circuit block (250a) may include a (feedback) cascode current mirror (250a1, 250a2) having an input leg (Mp1, Mpc1) coupled between the supply voltage, $V_{DD}$, and the intermediate output leg (220a2) such as to receive the current, $I_{OUT1}$, as input. Furthermore, the cascode current mirror (250a1, 250a2) may include respective output legs, (Mp2, Mpc2) and (M'p2, M'pc2), coupled between the supply voltage, $V_{DD}$, and the circuit block (250b, e.g., diode-connected transistors Mncgb and Mncga) that are configured to mirror the current, $I_{OUT1}$, of the input leg (Mp1, Mpc1), to generate therefrom the respective output currents, $I_{OFB}$ and $I'_{OFB}$. Furthermore, as described above with reference to FIG. 3, the gate voltage, $VG_{PC}$, shown in FIG. 5B, may be generated via conduction of a current, $I_{OUT2}$, through a diode-connected transistor, Mpcg, wherein the current, $I_{OUT2}$, and the transistor, Mpcg, may respectively be ratiometrically related to the current, $I_{OUT1}$, and to the transistor, Mpc1. As shown in FIG. 5B, the current, $I_{OUT2}$, may be generated by an additional (low-side) output leg (220a4), including transistors Mn3, Mnc3a, and Mnc3b.

The example configuration of the circuit block (250a) according to the details shown in FIG. 5B use high-side (p-type) (feedback) current mirror input/output legs comprising two transistors (i.e., one cascode transistor). As previously described, teaching according to the present disclosure may use a feedback current mirror that is not necessarily of a cascode type (e.g., single transistor per leg) for generation of the current $I_{OFB}$. Furthermore, as shown in FIG. 5B, a stack height used in the high-side current mirror may not necessarily be same as one used in the low-side current mirror. Increasing stack height of the high-side current mirror may require a corresponding increase in number of start-up transistors used in the circuit block (250a3) and a corresponding increase in number of circuits (or circuit elements) for generation of the cascode gate voltages. This is shown in FIG. 5C for a case where the high-side current mirror input/output legs (e.g., 250a1, 250a2) include a same stack height as the low-side current mirror input/output legs (e.g., 220a1, 220a2 of FIG. 5A).

Figure 5C:
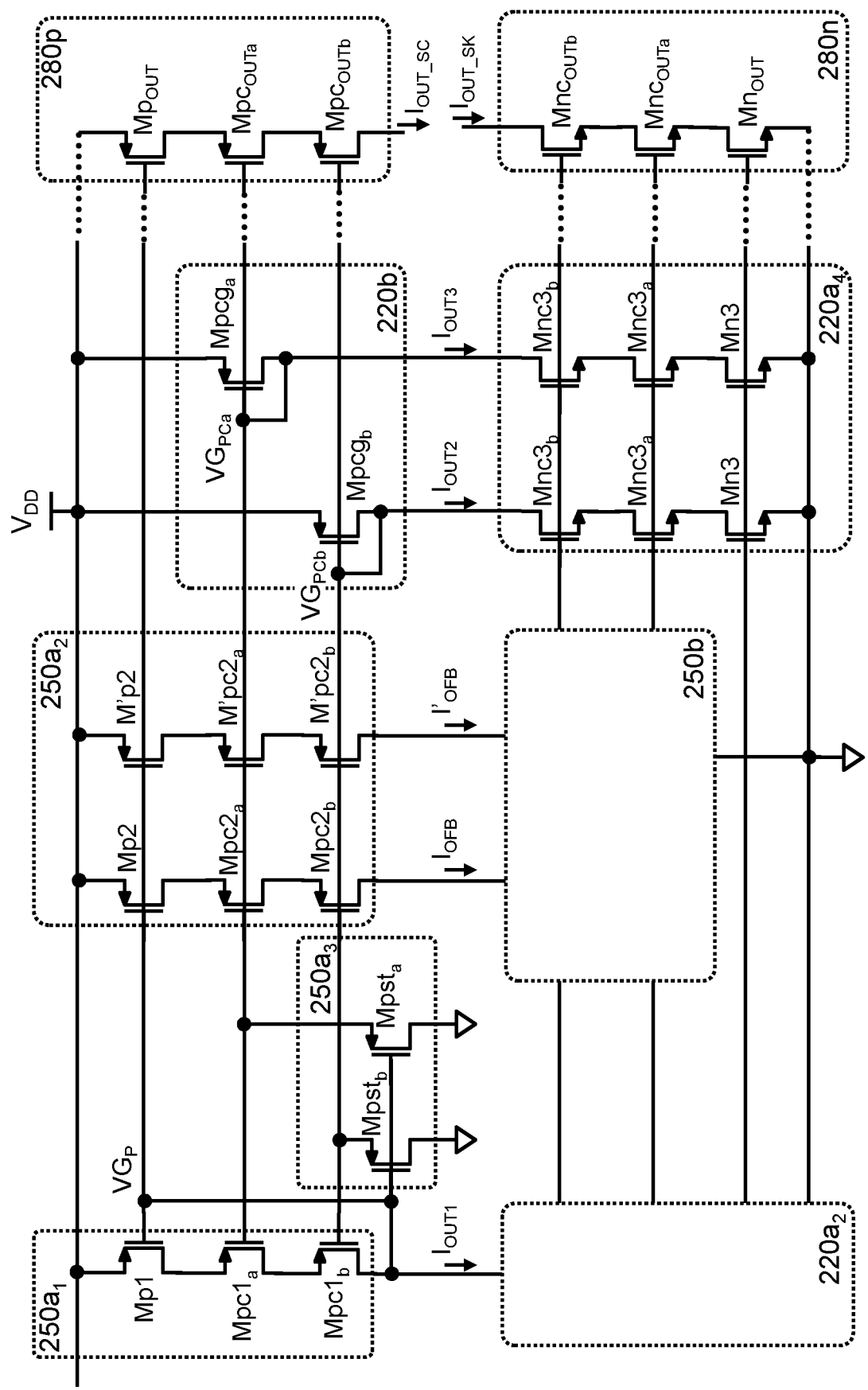
FIG. 5C shows details of another feedback block that may be used in the cascode current mirror of FIG. 5A.

With reference to FIG. 5C, the circuit block (250a3) may include start-up transistors (Mpsta, Mpstb) respectively coupled to cascode transistors (Mpc1a, Mpc1b) for generation of corresponding gate voltages during the transition mode of operation in a manner that may be likened to transistors (Mnsta, Mnstb) described above with reference to FIG. 5A. Likewise, generation of each of the cascode gate voltages ($VG_{PCa}$, $VG_{PCb}$) for operation during the steady-state mode of operation may be likened to generation of the cascode gate voltage, $VG_{PC}$, described above with reference to FIG. 5B.

It should be noted that using different stack heights for the main and feedback (cascode) current mirrors, or in other words, for the low-side and high-side (cascode) current mirrors as exemplified above with reference to FIGS. 3/4/5, may impact stack height of the low-side and high-side output legs (280n, 280p) as each of the low-side or high-side legs may include a same stack height. It should further be noted that use of a specific stack height may be in view of an expected high voltage coupled to the stack (e.g., at an output node of the stack) and respective (low) withstand voltage capability of individual transistors of the stack, such that the high voltage distributes over the individual transistors in a way that any such transistor is subjected to a voltage that is lower than the respective withstand voltage.

Figure 6:
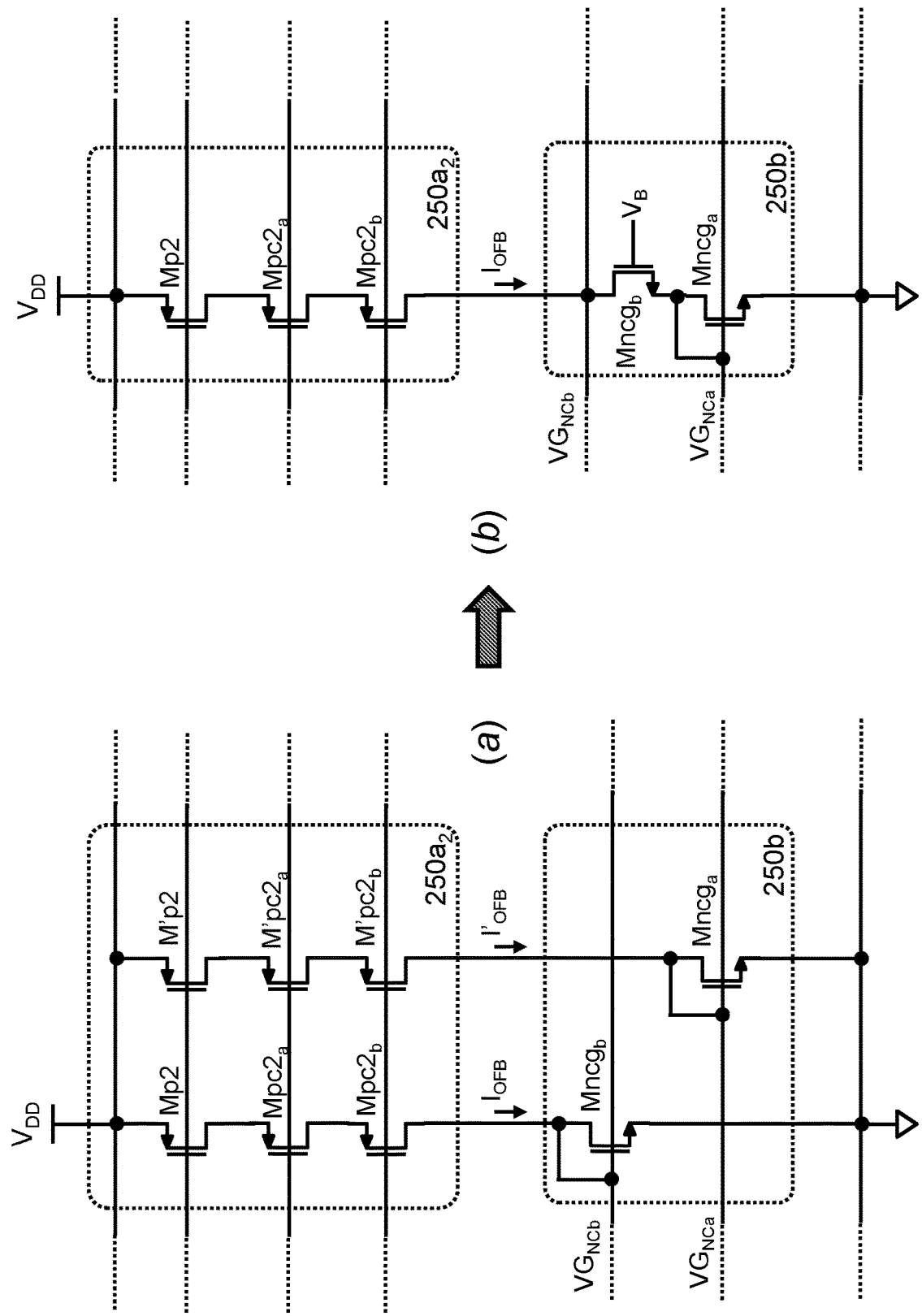
FIG. 6 shows alternative circuits according to embodiments of the present disclosure for generation of cascode gate voltages of the cascode current mirror of FIG. 4.

FIG. 6 shows alternative circuits according to embodiments of the present disclosure for generation of cascode gate voltages (e.g., $VG_{NCa}$, $VG_{NCb}$) of the cascode current mirror shown in FIG. 4. In particular, a configuration (a) of FIG. 6, which corresponds to the configuration shown in FIG. 4, may use two similar circuits for generation of each of the cascode gate voltages, $VG_{NCa}$ and $VG_{NCb}$, wherein each such circuit includes an output leg of a current mirror (e.g., Mp2, Mpc2a, Mpc2b or M'p2, M'pc2a, M'pc2b) to mirror a current (e.g., $I_{OFB}$ or $I'_{OFB}$) that is conducted through a (self-biasing) diode-connected transistor (e.g., Mncgb or Mncga). On the other hand, according to an embodiment of the present disclosure, a configuration (b) as shown in FIG. 6, may use a single (common) output leg (Mp2, Mpc2a, Mpc2b) to generate a single (common) current, $I_{OFB}$, that is conducted through two series-connected transistors (Mncga, Mncgb). Mncga is configured to generate $VG_{NCa}$ and the combination of Mncga and Mncgb generates $VG_{NCb}$. Transistor Mncgb is configured to generate a voltage across its drain to source that meets the voltage requirements for $VG_{NCb}$. The gate of Mncgb is coupled to a bias voltage $V_B$, where $V_B$ can be an internal bias voltage within the current mirror 500a, or $V_{DD}$, or an external bias voltage that is suitable to generate the needed voltage drop across Mncgb's drain to source with $I_{OFB}$ flowing through Mncgb. Thus, $VG_{NCb}$ is greater than $VG_{NCa}$ by the voltage drop across Mncgb.

Figure 7:
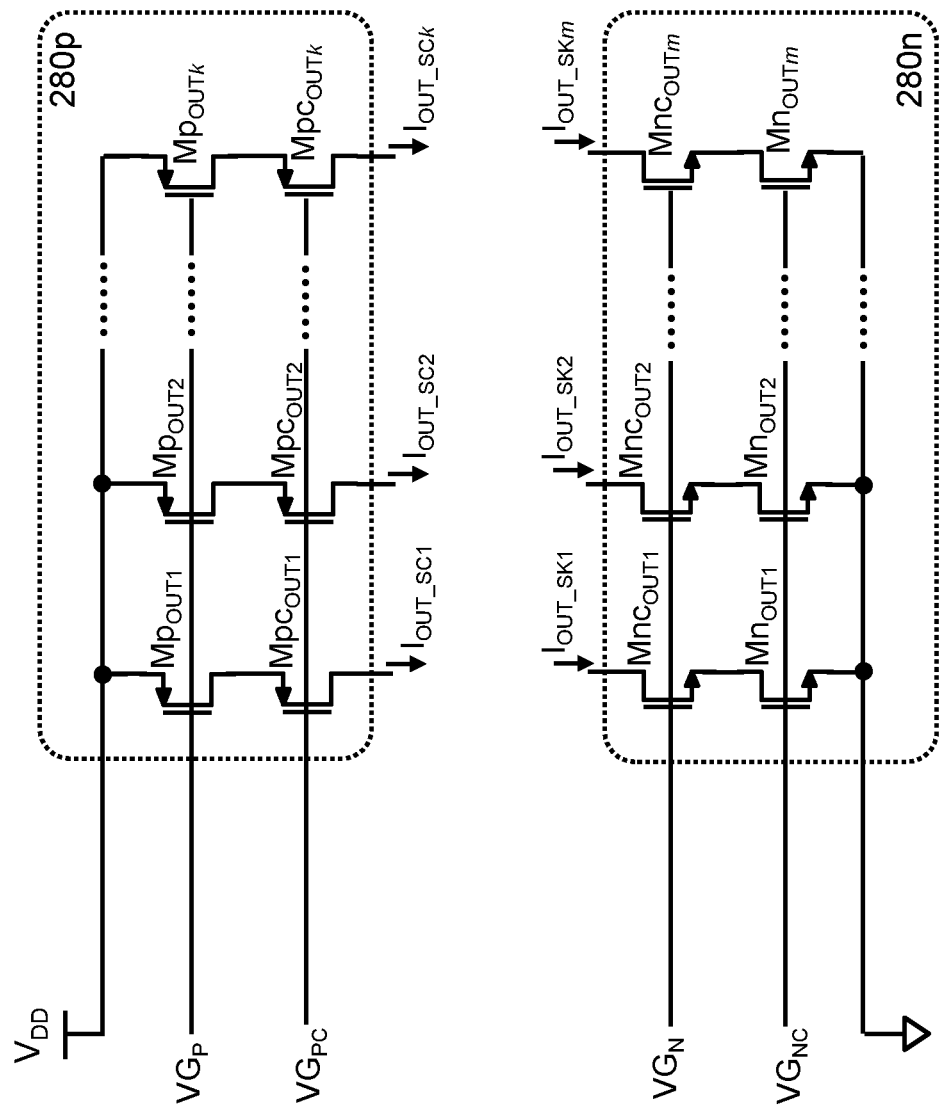
FIG. 7 shows details of an output stage of the cascode current mirror of FIG. 3.

FIG. 7 shows details of an output stage (280n, 280p) of the cascode current mirror according to the present teachings. As shown in FIG. 7, the output stage (280n, 280p) may include (complementary) low-side and high-side output stages, (280n) and (280p), wherein each such stage may include one or more (parallel) output (mirror) legs. For example, as shown in FIG. 7, the low-side output stage (280n) may include a number, m, of parallel (low-side) output legs (e.g., transistors of each leg indexed from 1 through m), for outputting of corresponding (sink) currents ($I_{OUT\_SK1}$, $I_{OUT\_SK2}$, ..., $I_{OUT\_SKm}$). Likewise, the high-side stage (280p) may include a number, k, of parallel (high-side) output legs (e.g., transistors of each leg indexed from 1 through k), for outputting of corresponding (source) currents ($I_{OUT\_SC1}$, $I_{OUT\_SC2}$, ..., $I_{OUT\_SCk}$). It should be noted that although the low- and high-side output stages (280n, 280p) may include respective stack heights that correspond to the respective stack heights of the low-side and high-side current mirrors used (e.g., main 220a1, 220a2 and dual 250a1, 250a2 of FIG. 3), and therefore may not be limited to a same and constant stack height.

Figure 8:
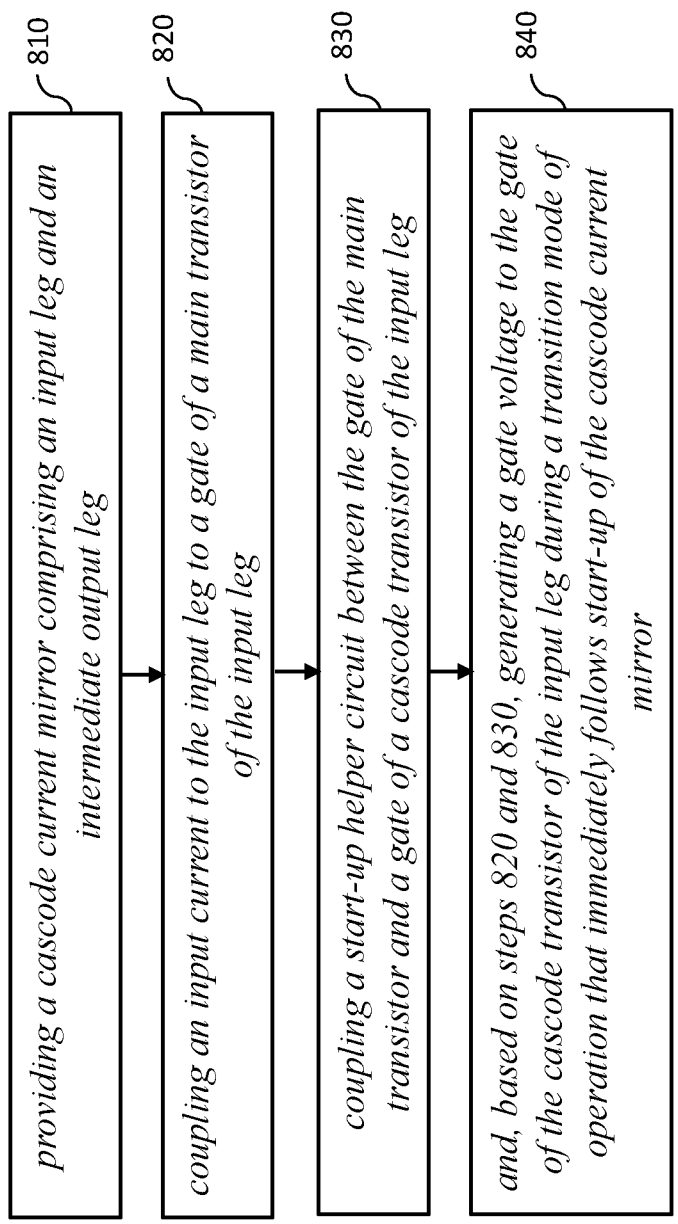
FIG. 8 is a process chart showing various steps of a method according to the present disclosure for operating a cascode current mirror with low headroom voltage.

FIG. 8 is a process chart (800) showing various steps of a method according to the present disclosure for operating a cascode current mirror with low headroom voltage. As can be seen in the process chart (800), such steps include: providing a cascode current mirror comprising an input leg and an intermediate output leg, per step (810); coupling an input current to the input leg to a gate of a main transistor of the input leg, per step (820); coupling a start-up helper circuit between the gate of the main transistor and a gate of a cascode transistor of the input leg, per step (830); based on steps (820) and (830), generating a gate voltage to the gate of the cascode transistor of the input leg during a transition mode of operation that immediately follows start-up of the cascode current mirror, per step (840).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A cascode current mirror circuit, comprising:
   an input leg comprising a first cascode stack of transistors;
   an intermediate output leg comprising a second cascode stack of transistors; and
   a feedback block comprising a feedback current mirror, the feedback block coupled to the intermediate output leg,
   wherein
   the feedback block is configured to generate a gate voltage to a cascode transistor of the input leg based on an intermediate current that is output by the intermediate output leg, and
   a headroom voltage for operation of the input leg as defined by a minimum voltage at an input of the input leg is equal to a gate-to-source voltage of a main transistor of the input leg.

2. The cascode current mirror circuit according to claim 1, wherein:
   the feedback block further comprises a diode-connected transistor coupled to a gate of said cascode transistor, and
   the feedback current mirror is configured to generate a mirrored intermediate current for conduction through the diode connected transistor.

3. The cascode current mirror circuit according to claim 2, wherein:
   the diode-connected transistor is configured to generate a self-biased gate voltage for conduction of the mirrored intermediate current, the self-biased gate voltage coupled to the gate of said cascode transistor.

4. The cascode current mirror circuit according to claim 2, wherein:
   the feedback current mirror comprises a feedback input leg configured to receive the intermediate current and a feedback output leg configured to generate the mirrored intermediate leg, and
   a polarity of the feedback current mirror as defined by a polarity of transistors of the feedback input leg and feedback output leg is opposite a polarity of the cascode current mirror circuit as defined by a polarity of transistors of the input leg and intermediate output leg.

5. The cascode current mirror circuit according to claim 4, further comprising:
   a start-up circuit coupled between an input to the input leg and respective gates of cascode transistors of the input leg, including said cascode transistor, at least during a portion of a transition mode of operation of the cascode current mirror circuit that immediately follows a start-up of the cascode current mirror; and
   an additional start-up circuit coupled between an input to the feedback input leg and respective gates of cascode transistors of the feedback input leg at least during a portion of said transition mode of operation,
   wherein
   the start-up circuit is configured to provide respective gate voltages to said cascode transistors of the input leg during said portion of the transition mode of operation, and
   the additional start-up circuit is configured to provide respective gate voltages to said cascode transistors of the feedback input leg during said portion of the transition mode of operation.

6. The cascode current mirror circuit according to claim 4, further comprising:
   an output current stage comprising complementary output legs for outputting a sink and a source current,
   wherein
   a first output leg of the complementary output legs mirrors an input current to the input leg, and
   a second output leg of the complementary output legs mirrors an input current to the feedback input leg.

7. The cascode current mirror circuit according to claim 1, further comprising:
   an output current stage comprising an output leg that mirrors an input current to the input leg.

8. The cascode current mirror circuit according to claim 1, further comprising:
a start-up circuit selectively coupled between an input to the input leg and a gate of the cascode transistor of the input leg.

9. The cascode current mirror circuit according to claim 1, further comprising:
a start-up circuit coupled between an input to the input leg and a gate of the cascode transistor of the input leg at least during a portion of a transition mode of operation of the cascode current mirror circuit that immediately follows a start-up of the cascode current mirror,
wherein
the start-up circuit is configured to provide the gate voltage to said cascode transistor during said portion of the transition mode of operation.

10. The cascode current mirror circuit according to claim 9, wherein:
the start-up circuit is configured to decouple from the gate of the cascode transistor of the input leg during a steady-state mode of operation of the cascode current mirror circuit that follows the transition mode of operation.

11. The cascode current mirror circuit according to claim 9, wherein:
the start-up circuit comprises a start-up transistor comprising a gate coupled to the input of the input leg, a source coupled to the gate of the cascode transistor of the input leg, and a drain coupled to one of supply voltage or a reference ground.

12. The cascode current mirror circuit according to claim 1, wherein:
the input leg is configured to receive an input current at the input of the input leg, and
the input of the input leg is coupled to a gate of the main transistor of the input leg.

13. The cascode current mirror circuit according to claim 12, wherein:
a voltage at the input of the input leg is equal to a gate-to-source voltage of the main transistor of the input leg.

14. The cascode current mirror circuit according to claim 1, wherein:
the headroom voltage is equal to about 0.6 volts.

15. A cascode current mirror circuit, comprising:
an input leg comprising a first cascode stack of transistors;
an intermediate output leg comprising a second cascode stack of transistors; and
a feedback block comprising a feedback current mirror, the feedback block coupled to the intermediate output leg,
wherein
the feedback block is configured to generate a gate voltage to a cascode transistor of the input leg based on an intermediate current that is output by the intermediate output leg,
the input leg is configured to receive an input current at an input of the input leg,
the input of the input leg is coupled to a gate of a main transistor of the input leg, and
the input of the input leg is a drain of said cascode transistor of the input leg.

16. A cascode current mirror circuit, comprising:
an input leg comprising a first cascode stack of transistors;
an intermediate output leg comprising a second cascode stack of transistors; and
a feedback block comprising a feedback current mirror, the feedback block coupled to the intermediate output leg; and
a start-up circuit coupled to an input to the input leg;
wherein:
the feedback block is configured to generate a gate voltage to a cascode transistor of the input leg based on an intermediate current that is output by the intermediate output leg,
the input leg is configured to receive an input current at an input of the input leg,
the input of the input leg is coupled to a gate of a main transistor of the input leg,
the input of the input leg is a drain of an additional cascode transistor of the input leg,
the start-up circuit is coupled between the input to the input leg and respective gates of the cascode and additional cascode transistors of the input leg at least during a portion of a transition mode of operation of the cascode current mirror circuit that immediately follows a start-up of the cascode current mirror, and
the start-up circuit is configured to provide the gate voltage and the additional gate voltage to said cascode transistors during said portion of the transition mode of operation.

17. The cascode current mirror circuit according to claim 16, wherein:
the start-up circuit is further configured to decouple from the respective gates of said cascode transistors of the input leg during a steady-state mode of operation of the cascode current mirror circuit that follows the transition mode of operation.

18. A cascode current mirror circuit, comprising:
an input leg comprising a first cascode stack of transistors;
an intermediate output leg comprising a second cascode stack of transistors; and
a feedback block comprising a feedback current mirror, the feedback block coupled to the intermediate output leg,
wherein
the feedback block is configured to generate a gate voltage to a cascode transistor of the input leg based on an intermediate current that is output by the intermediate output leg,
the input leg is configured to receive an input current at an input of the input leg,
the input of the input leg is coupled to a gate of a main transistor of the input leg,
the input of the input leg is a drain of an additional cascode transistor of the input leg, and
the feedback block is further configured to generate an additional gate voltage to the additional cascode transistor of the input leg based on the intermediate current.

19. The cascode current mirror circuit according to claim 18, wherein:
the feedback block further comprises an additional diode-connected transistor coupled to a gate of the additional cascode transistor, and
the feedback current mirror is configured to generate an additional mirrored intermediate current for conduction through the additional diode connected transistor.

20. The cascode current mirror circuit according to claim 19, wherein:
the feedback block further comprises an additional transistor coupled to a gate of the additional cascode transistor, and the additional transistor is in series connection with the diode-connected transistor for conduction of the mirrored intermediate current.

\* \* \* \* \*